(12) United States Patent
Piccolboni et al.

(10) Patent No.: US 10,438,660 B2
(45) Date of Patent: Oct. 8, 2019

(54) METHOD FOR DETERMINING A MEMORY WINDOW OF A RESISTIVE RANDOM ACCESS MEMORY

(71) Applicant: COMMISSARIAT A L'ENERGIE ATOMIQUE ET AUX ENERGIES ALTERNATIVES, Paris (FR)

(72) Inventors: Giuseppe Piccolboni, Verona (IT); Gabriel Molas, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/860,244

(22) Filed: Jan. 2, 2018

(65) Prior Publication Data
US 2018/0197603 A1 Jul. 12, 2018

(30) Foreign Application Priority Data

Jan. 6, 2017 (FR) ..................................... 17 50122

(51) Int. Cl.
*G11C 11/00* (2006.01)
*G11C 13/00* (2006.01)
*G11C 5/05* (2006.01)

(52) U.S. Cl.
CPC ........ *G11C 13/0069* (2013.01); *G11C 13/004* (2013.01); *G11C 13/0007* (2013.01); *G11C 13/0011* (2013.01); *G11C 13/0035* (2013.01); *G11C 5/05* (2013.01); *G11C 2013/0054* (2013.01)

(58) Field of Classification Search
CPC ............ G11C 13/0069; G11C 13/0007; G11C 13/0011; G11C 13/0035; G11C 13/004; G11C 5/05
USPC .......................................................... 365/148
See application file for complete search history.

(56) References Cited

U.S. PATENT DOCUMENTS

| | | | | |
|---|---|---|---|---|
| 7,633,797 B2 * | 12/2009 | Chen | ................... | G11C 16/0491 |
| | | | | 365/185.03 |
| 9,431,607 B2 * | 8/2016 | Molas | .................. | G11C 13/0011 |
| 9,633,725 B2 * | 4/2017 | Molas | .................. | G11C 13/0011 |

(Continued)

OTHER PUBLICATIONS

Search Report as issued in French Patent Application No. 1750122, dated Sep. 13, 2017.

(Continued)

*Primary Examiner* — Viet Q Nguyen
(74) *Attorney, Agent, or Firm* — Pillsbury Winthrop Shaw Pittman LLP

(57) ABSTRACT

A method for determining a memory window of at least one resistive random access memory cell, the resistive random access memory cell including a high resistance state and a low resistance state, the passage of the resistive random access memory from an initial state among the high resistance state or the low resistance state to another state then the return to the initial state forming a cycle, the method including: measuring the values of the resistances of the high resistance and low resistance states at a given cycle j, j being an integer; determining the memory window to use during the n cycles following the given cycle j, n being an integer, the memory window being calculated by taking into account at least the resistances of the high resistance and low resistance states at the cycle j.

8 Claims, 3 Drawing Sheets

(56) References Cited

U.S. PATENT DOCUMENTS

| | | | | |
|---|---|---|---|---|
| 9,722,177 | B2* | 8/2017 | Molas | H01L 45/08 |
| 9,748,477 | B2* | 8/2017 | Molas | H01L 45/1253 |
| 10,002,664 | B2* | 6/2018 | Vianello | G11C 13/0011 |
| 2008/0106925 | A1* | 5/2008 | Paz de Araujo | H01L 45/04 365/148 |
| 2008/0107801 | A1* | 5/2008 | Celinska | H01L 45/04 427/96.7 |
| 2013/0258753 | A1 | 10/2013 | Gopinath et al. | |
| 2018/0330783 | A1* | 11/2018 | Molas | G11C 13/0007 |
| 2018/0330786 | A1* | 11/2018 | Molas | G11C 13/0007 |

OTHER PUBLICATIONS

Piccolboni, G., et al., "Investigation of Cycle-to-Cycle Variability in $HfO_2$-Based OxRAM," IEEE Electron Device Letters, vol. 37, No. 6, Jun. 2016, XP011610886, pp. 721-723.

Piccolboni, G., et al., "Investigation of $HfO_2$/Ti based Vertical RRAM—Performances and Variability," 2014 $14^{th}$ Annual Non-Volatile Memory Technology Symposium (NVMTS), IEEE, Oct. 2014, XP032747392, pp. 1-5.

Cagli, C., et al., "About the intrinsic resistance variability in HfO2-based RRAM devices," 2017 Joint International EUROSOI Workshop and International Conference on Ultimate Integration on Silicon (EUROSOI-ULIS), Apr. 2017, XP033110881, pp. 31-34.

Calderoni, A., et al., "Performance Comparison of O-based and Cu-based ReRAM for High-Density Applications," Memory Workshop (IMW), 2014 IEEE 6th International, 4 pages.

Vianello, E., et al., "Resistive Memories for Ultra-Low-Power embedded computing design," Electron Devices Meeting 2014 IEEE International, 4 pages.

* cited by examiner

METHOD FOR DETERMINING A MEMORY WINDOW OF A RESISTIVE RANDOM ACCESS MEMORY

CROSS-REFERENCE TO RELATED APPLICATION

This application claims priority to French Patent Application No. 1750122, filed Jan. 6, 2017, the entire content of which is incorporated herein by reference in its entirety.

TECHNICAL FIELD OF THE INVENTION

The present invention relates to the field of rewritable non-volatile memories and more specifically that of resistive random access memories. One object of the present invention is a method for determining a memory window of a resistive random access memory. Another object of the present invention is a method for using a resistive random access memory.

PRIOR ART

A resistive random access memory is a device comprising at least one first and one second electrode. The two electrodes are separated by a layer made of electrically insulating material. By applying an opportunely chosen difference in electrical potential to the electrodes, a conductive filament connecting the first electrode and the second electrode is formed or destroyed.

When the conductive filament is present, the resistive random access memory is in a low electrical resistance state, also called conducting state or ON state. The elimination of the electrical filament makes the resistive random access memory switch to a high electrical resistance state, called insulating state or OFF state. The existence of these two states makes it possible to use the resistive random access memory as a support for recording information. For example a resistive random access memory cell makes it possible to save an information bit. A resistive random access memory cell is also called memory point.

Several mechanisms may be responsible for the formation of the filament connecting the two electrodes (see for example the article "Resistive Memories for Ultra-Low-Power Embedded Computing Design" published by E. Vianello et al. in Electron Devices Meeting 2014 IEEE International). For example, in the case of memory cells known as OxRAM, the filament forms from mobile ions present in the dielectric material separating the two electrodes. Alternatively, in resistive random access memories known as CBRAM (Conductive Bridging RAM) one of the two electrodes supplies the ions which, in dissolving in the dielectric material, forms the filament.

The passage from an ON state to an OFF state or vice-versa is called a cycle. During the use of a resistive random access memory, a large number of cycles is carried out, because each writing operation in a memory cell corresponds to a cycle of the cell.

The resistance values of the ON and OFF states of a same cell may vary significantly during its use. This variability can pose problems of reliability in reading information recorded in the cell. For example, when a large number of cycles is carried out, the ON state with the highest resistance may be relatively close to the OFF state with the lowest resistance.

The small difference between the least conductive written state and the most resistive erased state may lead to errors in the reading of the memory cell and thus to resistive random access memories that are not very reliable. In other words, this small difference makes the distinction of the ON state from the OFF state difficult. This results in frequent errors of reading information recorded in the memory and thus a general lack of reliability of the memory device.

One parameter used to characterise the quality of a resistive random access memory cell is its memory window. The memory window of a cell is defined as an interval of resistance values comprised between two bounds. The lower bound is the highest resistance value among the resistances of the ON states. The upper bound is the lowest resistance value among the resistances of the OFF states. A narrow memory window is thus associated with OFF and ON states with resistance values brought closer together, which leads to problems of reliability of the resistive memory cell.

The factors for reducing the width of the memory window are essentially linked to the variability of the OFF and ON states of a same cell during its use.

This variability is a limitation to the exploitation of resistive random access memories at a large scale, especially since, in real applications, a large number of memory cells is used. In addition to variability at the level of the individual cell, there is variability due to the simultaneous use of several cells which, even though nominally identical, inevitably have slightly different properties (see for example "Performance Comparison of O-based and Cu-based ReRAM for High-Density Applications" by A. Calderoni et al. published in "Memory Workshop (IMW), 2014 IEEE 6th International".

Technical Problem

To overcome the technical difficulties described above, the invention relates to a method for determining a widened memory window enabling greater reliability in reading and writing the resistive random access memory.

SUMMARY OF THE INVENTION

The present invention relates to a method for determining a memory window of at least one resistive random access memory cell, the resistive random access memory cell comprising a high resistance state and a low resistance state, the passage of the resistive random access memory from an initial state among the high resistance state or the low resistance state to another state then the return to the initial state forming a cycle, said method comprising the following steps:
 measuring the values of the resistances of the high resistance and low resistance states at a given cycle j, j being a strictly positive integer;
 determining the memory window to use during the n cycles following the given cycle j, n being a strictly positive integer, the memory window being calculated by taking into account the resistances of the high resistance and low resistance states at the cycle j and the variabilities of the resistances of the high resistance and low resistance states during the n cycles;
the integer n, the variability of the resistance of the high resistance state and the variability of the resistance of the low resistance state being determined beforehand from at least one reference memory cell having substantially the same characteristics as those of the resistive random access memory cell, the integer n determined beforehand being the number of successive cycles during which the resistances of the high resistance state (R_HRS) or the low resistance state (R_LRS) of the reference memory cell are correlated.

Low resistance state or ON state of the resistive random access memory cell is taken to mean a state in which the resistive random access memory has a low electrical resistance. High resistance state or OFF state of the memory window is taken to mean a state in which the resistive random access memory has a high resistance.

Memory window is taken to mean an interval of resistance values having a lower bound and an upper bound.

States having a resistance lower than the lower bound of this interval are considered as ON states.

States having a resistance higher than the upper bound of this interval are considered as OFF states.

The index j is an integer used to number the cycles of the resistive random access memory.

Variability of the resistance of an ON or OFF state during n cycles is taken to mean a measurement of the dispersion of the resistance values measured during the n cycles.

Correlation between two resistance values of a given state of the resistive random access memory is taken to mean the two values being measured at two different cycles, the fact that the value measured at a first cycle depends on the value measured at a second cycle.

The method according to the invention comprises at least two steps.

A first step of the method according to the invention is the measurement of the resistance values of the ON and OFF states at a given cycle j.

This step makes it possible to characterise the state of the resistive random access memory at the cycle j.

A second step comprises the determination of the memory window to use during the n cycles successive to the state j.

During this step, the memory window is determined from resistance values measured at the first step and by taking into account the variabilities of the resistances of the OFF and ON states during the n cycles.

The number n of cycles during which the memory window according to the invention is used as well as the variabilities of these resistances during these n cycles are determined beforehand from a reference memory cell.

Reference memory cell is taken to mean a memory cell having the same characteristics as the studied memory cell. The reference memory cell is for example a memory cell manufactured with the same technology, the same geometry and the same materials as the resistive random access memory cell.

Alternatively, these parameters may be determined beforehand from the same memory cell for which the memory window is determined.

The aim of the invention is to describe a method for determining the memory window of at least one resistive memory cell. The method according to the invention makes it possible to increase the memory window over a limited number of cycles thanks to knowledge of the resistance at the preceding cycle and the existence of a correlation between adjacent cycles.

The number of cycles during which the memory window is increased is chosen beforehand as being the number of cycles during which the resistance values of the OFF state or the ON state are correlated. The existence of a correlation between resistance values implies a reduced variability of these values throughout the duration of the correlation.

According to what is known to those skilled in the art, the determination of the memory window stakes place by carrying out a large number of cycles and by considering the difference between the OFF state with the lowest resistance and the ON state with the highest resistance. This approach is valid both for an isolated cell and for a set of memory cells and comes down to taking into account the greatest variability observable in the system. Taking into account this overall variability reduces the memory window and makes the distinction of the ON state and the OFF state less reliable and reproducible.

The invention exploits the fact that the memory window at a cycle j is linked to the memory window at the n cycles following the cycle j. The n cycles during which the memory window is correlated with the memory window measured at the cycle j represent a correlation length for the memory window.

For example, the correlation length n is determined by calculating a correlation coefficient and by setting a minimum value of the correlation coefficient, below which it is considered that the resistance values are de-correlated.

The correlation length n is a characteristic of the technology used in the manufacture of resistive random access memory cells and the materials used during manufacture. Once determined, this correlation length may be considered as a manufacturing parameter of the device.

Thanks to the correlation between successive cycles, the resistance values of the OFF and ON states have reduced variability during the n cycles. This makes it possible to define, throughout the duration of the correlation, a widened memory window.

The memory window retained during the n cycles successive to the cycle j and determined at the second step of the method according to the invention is a widened window compared to the memory window according to the prior art, which takes into account the overall variability of the OFF and ON states of the memory.

In other words, the invention makes it possible to adjust the conditions of reading the cell, and in particular the resistance thresholds making it possible to distinguish an OFF state from an ON state, by taking into account the correlation between the resistance values at successive cycles. This makes it possible to avoid taking into account the overall variability of the ON and OFF states, which constitutes a significant reduction factor of the memory window in a method for using a resistive random access memory cell according to the prior art.

One advantage of the method according to the invention is to be able to increase the memory window associated with the resistive random access memory, which implies greater reliability in the distinction of the ON and OFF states.

Another advantage of the invention is the fact of being able to use lower applied voltages. In general, the application of lower voltages leads to a narrower memory window, due to the fact that the ON state and the OFF state have closer resistance values. However, the use of the method according to the invention makes it possible to avoid the reduction in memory window due to the natural variability of the OFF and ON states. The use of lower voltages for writing/re-writing of the memory point also enables an extension of the lifetime of the device.

The method according to the invention may also have one or more of the characteristics below, considered individually or according to all technically possible combinations thereof:

the number of cycles n determined beforehand is a correlation length of the resistance values of the high resistance state or the low resistance state, said resistance values being measured at successive cycles, said correlation length being defined as the number of cycles during which a correlation coefficient is above a threshold;

the correlation threshold is determined from an experimental measurement of the correlation coefficient;

the memory window to use during the n cycles following a given cycle j comprises a threshold for the ON state given by the sum of the resistance of the low resistance state at the cycle j and a fraction of the variability of the resistance of the low resistance state and a threshold for the OFF state given by the difference between the resistance of the high resistance state at the cycle j and a fraction of the variability of the resistance of the high resistance state;

the variability determined beforehand of the resistance of the high resistance state and the variability determined beforehand of the resistance of the low resistance state are defined as being the full width at half maximum of the distributions of the resistance values of the high resistance state and resistance of the low resistance state measured during n cycles;

the variability determined beforehand of the resistance of the high resistance state is defined as being the difference between the maximum value and the minimum value among the resistance values of the high resistance state measured during n cycles and the variability determined beforehand of the resistance of the low resistance state is defined as being the difference between the maximum value and the minimum value among the resistance values of the low resistance state measured during n cycles.

the resistive random access memory is an OxRAM or CBRAM type memory.

Another object of the invention is a method for using at least one resistive random access memory cell comprising the steps of:

determining the memory window at the cycle j by means of the method according to the invention described above;

at the cycle j saving the memory window in a memory support;

using the memory window during n cycles following the cycle j;

every n cycles renewing the memory window and saving it in the memory support.

LIST OF FIGURES

Other characteristics and advantages of the invention will become clear from the description given below for indicative purposes and in no way limiting, with reference to the appended figures, among which:

FIG. 2b represents a horizontal section of FIG. 3a;

DETAILED DESCRIPTION

Figure 1:
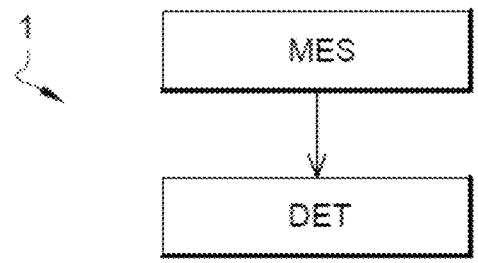
FIG. 1 represents the steps of the method for determining a memory window according to the invention.

FIG. 1 shows the steps of the method 1 for determining a memory window VF_n of at least one resistive random access memory cell according to the invention.

The first step MES of the method 1 according to the invention comprises the measurement of the resistances Rj_HRS of an OFF state and Rj_LRS of an ON state of the resistive random access memory at a given cycle j.

The second step of the method 1 according to the invention comprises the determination of the memory window VF_n. The memory window VF_n is used during the n cycles successive to the cycle j. The memory window VF_n is determined on the basis of the resistance values determined at the step MES. In addition, the memory window VF_n takes into account the variability dR_HRS of the resistance values of the OFF state and the variability dR_LRS of the resistance values of the ON state.

The number of cycles n and the variabilities of the ON and OFF states are determined beforehand from a reference memory cell having the same characteristics as the considered resistive random access memory cell.

The integer n determined beforehand is the number of successive cycles during which the resistances of the OFF state R_HRS or the ON state R_LRS are correlated.

One advantage of the invention is to exploit the reduced variability of the resistance values due to the existence of correlation at successive cycles. This makes it possible to define a widened memory window during the n cycles.

According to one embodiment of the method 1 the number of cycles n is a correlation length between resistance values of the OFF state HRS or the ON state LRS measured at successive cycles. For example, the correlation length n is defined as being the number of cycles during which a correlation coefficient C is above a threshold S.

According to one embodiment the correlation coefficient between two resistance values of a state of the memory cell is defined according to the following formula:

$$CC_{i,j} = \frac{\sum_{k=1}^{n}(\text{Cycle}_i - \mu_{\text{Cycle}i})(\text{Cycle}_j - \mu_{\text{Cycle}j})}{\sqrt{\sum_{k=1}^{n}(\text{Cycle}_i - \mu\text{Cycle}_i)^2}\sqrt{\sum_{k=1}^{n}(\text{Cycle}_j - \mu\text{Cycle}_j)^2}}$$

The correlation coefficient is calculated from the variable "Cycle" which is a vector containing the resistances measured at a given cycle for the set of studied memory cells.

This calculation makes it possible to quantify the correlation length for a given technology and programming conditions. One advantage of this embodiment is to calculate in a precise and reproducible manner the correlation between successive cycles of the memory cell.

Figure 2A:
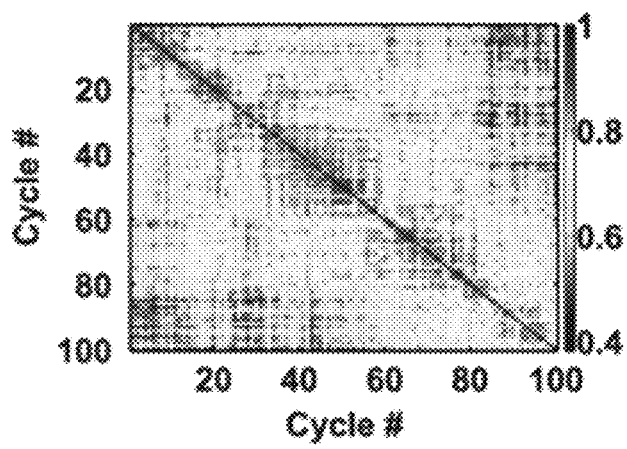
FIG. 2a represents the matrix of correlation coefficients obtained for a set of OXRAM cells, the correlation coefficient enabling the method shown in FIG. 1 to be implemented.

An example of experimental measurement of the correlation coefficient C is shown in FIG. 2a, which represents the matrix of correlation coefficients. The axes of FIG. 2a represent the i-th cycles. Each point of FIG. 3a represents the correlation coefficient between the cycle corresponding to the abscissa of the point and the cycle corresponding to its ordinate. FIG. 2a shows that the correlation is high between points close to the diagonal, that is to say for adjacent cycles. On the other hand, the correlation is very low for points distant from the diagonal, that is to say between cycles spaced over time.

One advantage of this embodiment is to provide a quantitative and reproducible method for the determination of correlation at successive cycles.

According to one embodiment the threshold S is determined from an experimental measurement of the correlation coefficient C.

Figure 2B:
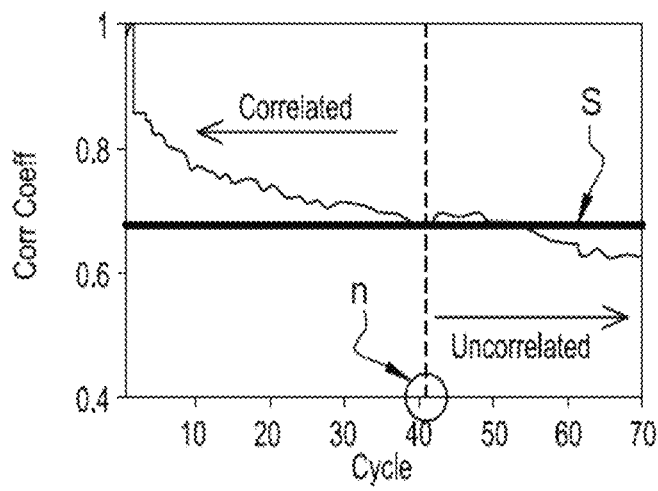

An example of this embodiment is shown in FIG. 2b which represents a single dimensional section along one of the two axes of FIG. 2a.

According to the embodiment illustrated in FIG. 2b, the threshold S is defined as the asymptotic value of the correlation coefficient C. The intersection between the threshold S and the curve representing the correlation coefficient of FIG. 2b identifies a point of which the abscissa is the correlation length n.

One advantage of this embodiment is to use a precise and reproducible experimental definition of the correlation threshold S and to take into account the specific properties of each memory cell or the set of characterised memory cells.

Figure 2C:
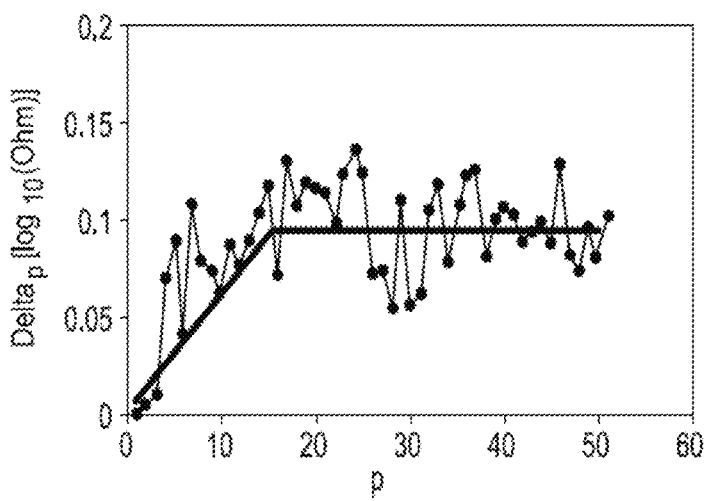
FIG. 2c shows the variation in resistance of a state of a resistive memory cell as a function of the number of cycles carried out, illustrating the loss of correlation observed in FIG. 2b.

The correlation length is the number of cycles during which the variation in the resistance values R_HRS and R_LRS is reduced. As shown in FIG. 2c, the difference between the resistance measured at the i-th state and the resistance measured at the i+p state increases to increase it by p, which is a consequence of the de-correlation of the resistance values to increase it by p. In other words, by moving away from a given cycle, the variability of the thresholds identifying the RHS and LHS states increases.

According to one embodiment, the memory window VF_n to use during the n cycles successive to a given cycle j comprises a lower bound given by the sum between the resistance of the ON state Rj_LRS at the cycle j and a fraction of the variability of the resistance of the ON state dR_LRS and an upper bound given by the difference in the resistance of the OFF state Rj_HRS at the cycle j and a fraction of the variability of the resistance of the OFF state dR_HRS.

For example, the lower bound is calculated according to the formula Rj_LRS+0.5*dR_LRS and the upper bound is calculated according to the formula Rj_HRS−0.5*dR_HRS.

According to one embodiment, the variability determined beforehand of the resistance of the OFF state dR_HRS and the variability determined beforehand of the resistance of the ON state dR_LHS are defined as being the full width at half maximum of the distributions of the resistance values of the OFF state R_HRS and the resistance of the ON state R_LRS measured during n cycles.

The advantage of this embodiment is to take into account the fact that nominally identical memory cells may have slightly different characteristics resulting in different resistance values. By taking into account the width of the distributions it is possible to take into account this variability due to heterogeneity of the memory cells.

The method 1 according to the invention is thus suited to defining a widened memory window also in the case of use of several resistive random access memory cells.

According to one embodiment, the variability determined beforehand of the resistance of the OFF state dR_HRS is defined as being the difference between the maximum value and the minimum value among the resistance values of the OFF state HRS measured during n cycles and the variability determined beforehand of the resistance of the ON state dR_LHS is defined as being the difference between the maximum value and the minimum value among the resistance values of the ON state R_LRS measured during n cycles.

Figure 3:
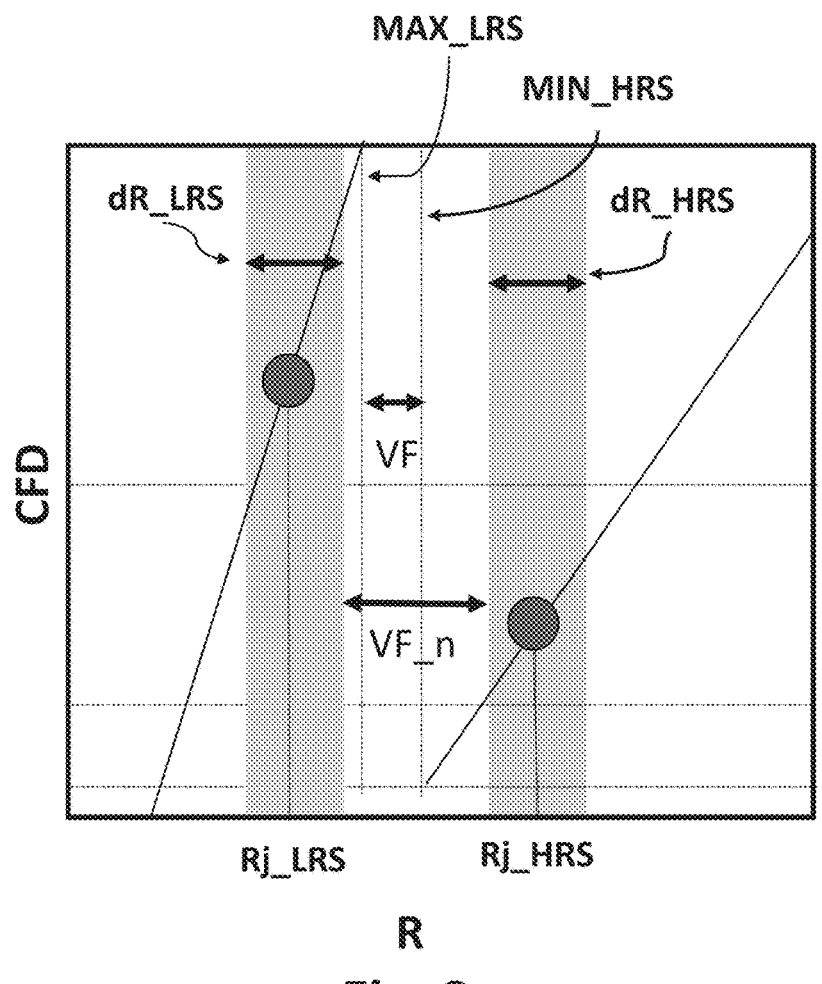
FIG. 3 shows the memory window obtained with the method illustrated in FIG. 1 and compares it to the memory window according to the prior art.

FIG. 3 shows the advantage of the method 1 according to the invention compared to the prior art.

In a method according to the prior art the thresholds for using the memory cell are chosen by considering the overall variability of the ON state LRS and the OFF state HRS for a use of the cell over a large number of cycles. The memory window VF according to the prior art is thus determined by the most restrictive values for each of the two states: the minimum resistance value for the OFF state HRS and the maximum value for LRS.

According to the prior art, the value of memory window to retain in the case of FIG. 2 is for example given by VF=MIN_HRS−MAX_LRS.

On the other hand, the method 1 according to the invention targets the determination of a widened memory window value VF_n compared to the prior art and valid around a given working point. The thresholds defined by the window VF_n are valid from the cycle j up to the cycle j+n.

The arrows dR_HRS and dR_LRS of FIG. 2 respectively represent the variability of the resistance of the state HRS and that of the state LRS calculated over n cycles.

As shown in FIG. 3, the memory window value according to the invention VF_n is widened compared to the memory window value VF calculated according to the prior art.

The widened memory window value according to the invention VF_n is valid from the cycle j and up to the cycle j+n.

At the cycle j+n new values Rj+n_HRS, Rj+n_LRS are measured and the memory window VF_n is renewed.

Figure 4:
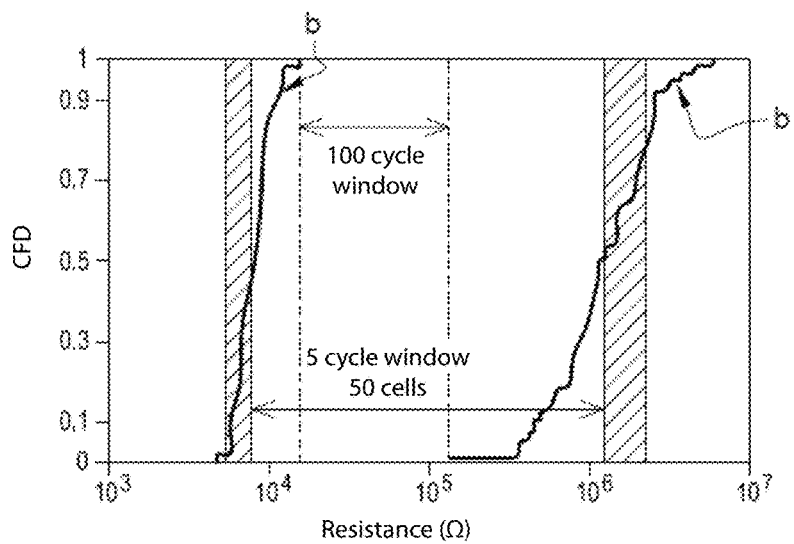
FIG. 4 shows the experimental determination of the memory window in a real case according to the method of FIG. 1.

FIG. 4 shows an example of experimental choice of the memory window for a set of cells. The curve b shows the cumulative distribution function of the resistances measured for the states LRS and HRS for 100 cycles. The vertical strips show the variability of the OFF and ON states for n=5 cycles, n being the correlation length. It is obvious in this figure that the variability over 100 cycles is much greater than the variability over 5 cycles. The memory window that takes into account the variability over 5 cycles is thus widened compared to the memory window that takes into account the variability over 100 cycles.

Advantageously, the invention makes it possible to choose a widened memory window in correspondence with a given working point.

The method 1 according to the invention may apply to memory cells of OxRAM, CBRAM type or to any other type of memory cell.

Another object of the present invention is a method 100 for using at least one resistive memory cell using the method 1 for determining a widened memory window VF_n.

Figure 5:
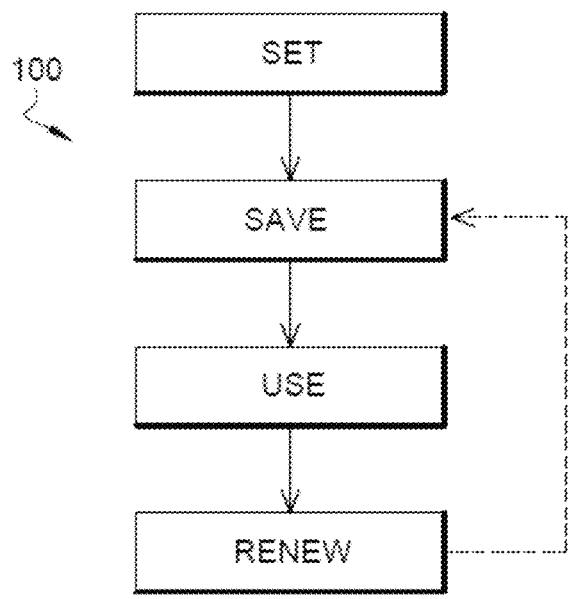
FIG. 5 shows the steps of the method for using the memory cell according to the invention.

The method 100 of use is shown in FIG. 5.

The method 100 provides a first step SET of determining the memory window VF_n according to the method 1.

To use the at least one resistive memory cell around a given operating point, for example around a given cycle j, the set of parameters making it possible to determine the memory window VF_n is saved in a memory support M. This saving step is the step SAVE of FIG. 5.

This set of parameters comprises for example the memory window VF_n, the resistance values of the ON and OFF states at the state j, the variabilities of the ON and OFF states over the correlation length. Any other parameter necessary for the operation of the at least one memory cell may also be saved during this step of the method.

During the n cycles successive to the cycle j the parameters determined at the step DET and saved at the step SAVE are used for operations of reading and writing the resistive random access memory cell.

After n cycles, the use of the memory cell or the set of memory cells is interrupted to redefine the working point of the system. The values of the parameters necessary for the determination of VF_n are re-measured at the step RENEW. At the cycle j+n new values Rj+n_HRS, Rj+n_LRS are measured and the memory window is renewed.

The new values are then saved and the method returns to the step SAVE.

Advantageously, the method 100 makes it possible to use a resistive random access memory cell or a set of resistive random access memory cells while retaining a widened memory window compared to the prior art. This is possible thanks to the fact that the memory window VF_n is renewed every n cycles, n being the correlation length of the memory window.

The invention claimed is:

1. A method for determining a memory window of at least one resistive random access memory cell, the resistive random access memory cell comprising a high resistance state and a low resistance state, a passage of the resistive random access memory from an initial state among the high resistance state or the low resistance state to another state then a return to the initial state forming a cycle, said method comprising:
   measuring values of the resistances of the high resistance state and the low resistance state at a given cycle j, j being an integer;
   determining the memory window to use during n cycles following the given cycle j, n being an integer, the memory window being calculated by taking into account the resistances of the high resistance and low resistance states at the cycle j and variabilities of the resistances of the high resistance and low resistance states during the n cycles;
the integer n, the variability of the resistance of the high resistance state and the variability of the resistance of the low resistance state being determined beforehand from at least one reference memory cell having substantially the same characteristics as those of the resistive random access memory cell, the integer n determined beforehand being the number of successive cycles during which the resistances of the high resistance state or the low resistance state of the reference memory cell are correlated.

2. The method according to claim 1, wherein the number of cycles n determined beforehand is a correlation length of the resistance values of the high resistance state or the low resistance state, said resistance values being measured at successive cycles, said correlation length being defined as the number of cycles during which a correlation coefficient is above a threshold.

3. The method according to claim 2, wherein the correlation threshold is determined from an experimental measurement of the correlation coefficient.

4. The method according to claim 1, wherein the memory window to use during the n cycles following a given cycle j comprises a threshold for the low resistance state given by the sum of the resistance of the low resistance state at the cycle j and a fraction of the variability of the resistance of the low resistance state and a threshold for the high resistance OFF state given by the difference between the resistance of the high resistance state at the cycle j and a fraction of the variability of the resistance of the high resistance state.

5. The method according to claim 1, wherein the variability determined beforehand of the resistance of the high resistance state and the variability determined beforehand of the resistance of the low resistance state are defined as being the full width at half maximum of the distributions of the resistance values of the high resistance state and the resistance of the low resistance state measured during n cycles.

6. The method according to claim 1, wherein the variability determined beforehand of the resistance of the high resistance state is defined as being the difference between the maximum value and the minimum value among the resistance values of the high resistance state measured during n cycles and the variability determined beforehand of the resistance of the low resistance state is defined as being the difference between the maximum value and the minimum value among the resistance values of the low resistance state measured during n cycles.

7. The method according to claim 1, wherein the resistive random access memory is an OxRAM or CBRAM type memory.

8. A method for using a resistive random access memory comprising:
   determining the memory window at the cycle j by means of the method for determining according to claim 1;
   at the cycle j saving the memory window in a physical memory support;
   using the memory window during n cycles following the cycle j;
   for every n cycles renewing the memory window and saving it in the physical memory support.

* * * * *